Figure 1:
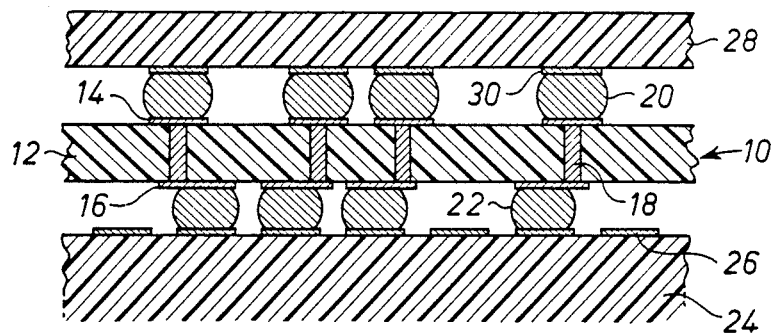

United States Patent [19]

Boegh-Petersen

[11] Patent Number: 4,833,402
[45] Date of Patent: May 23, 1989

[54] CONNECTOR ASSEMBLY FOR A CIRCUIT BOARD TESTING MACHINE, A CIRCUIT BOARD TESTING MACHINE, AND A METHOD OF TESTING A CIRCUIT BOARD BY MEANS OF A CIRCUIT BOARD TESTING MACHINE

[76] Inventor: Allan Boegh-Petersen, Flongvaenget 14, Hedehusene, DK-2640, Denmark

[21] Appl. No.: 116,547

[22] Filed: Nov. 4, 1987

Related U.S. Application Data

[62] Division of Ser. No. 770,867, filed as Pct DK85/00057 on Jun. 12, 1985, published as WO86/00173 on Jan. 3, 1986, Pat. No. 4,707,657.

[30] Foreign Application Priority Data

Jun. 13, 1984 [DK] Denmark .............................. 2911/84

[51] Int. Cl.$^4$ ......................... G01R 31/28; H05K 1/02
[52] U.S. Cl. ............................. 324/158 F; 324/73 PC; 324/158 P
[58] Field of Search ........... 324/158 F, 158 P, 73 PC; 439/55, 59, 60, 61, 62, 65, 74, 75

[56] References Cited

U.S. PATENT DOCUMENTS

| | | | |
|---|---|---|---|
| 3,654,585 | 4/1972 | Wickersham | 324/158 FX |
| 4,249,302 | 2/1981 | Crepeau | 439/74 X |
| 4,659,155 | 4/1987 | Walkup et al. | 439/60 X |

FOREIGN PATENT DOCUMENTS

| | | | |
|---|---|---|---|
| 3441578 | 5/1986 | Fed. Rep. of Germany | 324/158 F |
| 0155374 | 9/1983 | Japan | 324/158 F |
| 2095048 | 9/1982 | United Kingdom | 324/158 F |

Primary Examiner—Reinhard J. Eisenzopf
Assistant Examiner—Vinh P. Nguyen
Attorney, Agent, or Firm—Dennison, Meserole, Pollack & Scheiner

[57] ABSTRACT

A machine for testing a circuit board of an electrically insulating material includes circuit tracks of an electrically conductive material arranged on one or opposite side surfaces. At least one test surface is provided. The test surface or each of them defines a number of test points electrically insulated relative to one another and arranged in a matrix configuration. For establishing electrically conductive connection between selected test points of the test surface and selected areas, e.g. circuit tracks of the circuit board to be tested, a connector assembly is sandwiched between the one side surface of the circuit board to be tested and the test surface. The connector assembly is a double-sided circuit board having individual connectors arranged on first and second side surfaces of the circuit board and connected through conductors extending through the circuit board in a configuration corresponding to the selected areas of the circuit board to be tested and the selected points of the test surface, respectively.

18 Claims, 4 Drawing Sheets

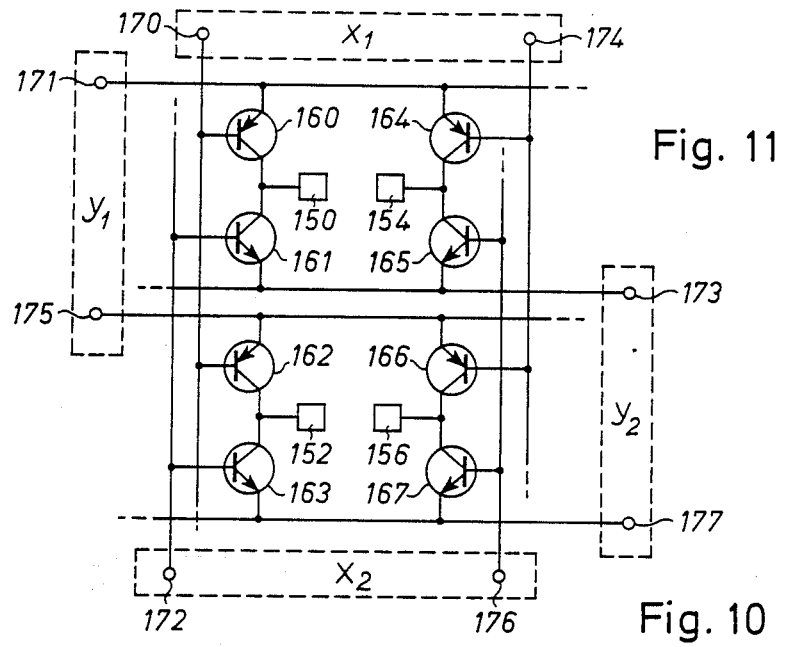
Fig. 11
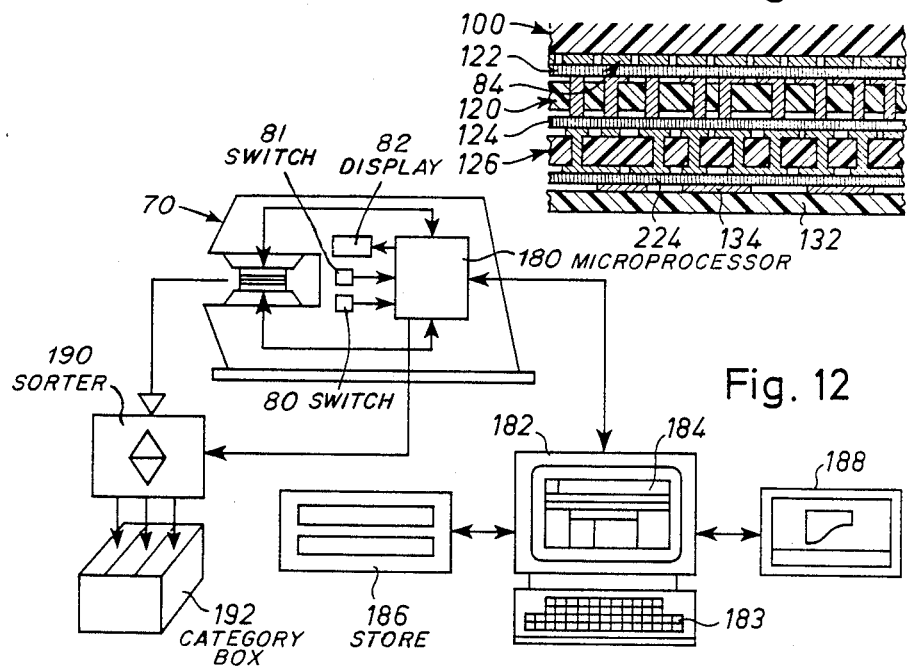
Fig. 10
Fig. 12

CONNECTOR ASSEMBLY FOR A CIRCUIT BOARD TESTING MACHINE, A CIRCUIT BOARD TESTING MACHINE, AND A METHOD OF TESTING A CIRCUIT BOARD BY MEANS OF A CIRCUIT BOARD TESTING MACHINE

This is a division of copending application Ser. No. 770,867, filed as PCT DA85/00057 on Jun. 12, 1985, published as WO86/00173 on Jun. 3, 1986, now U.S. Pat. No. 4,707,657.

The present invention relates to a connector assembly for a circuit board testing machine.

Hitherto a visual inspection or examination of circuit boards, especially printed circuit boards, has been a sufficient "testing" routine as to the correctness of single-sided or double-sided printed circuit boards. However, the appearance of more complex, more compact, more elaborated, and consequently more expensive circuit boards, such as thin-film or thick-film circuit boards, i.e. circuit boards including circuit tracks provided in thin-film or thick-film technique, respectively, multi-layer printed circuit boads, i.e. printed circuit boards including several layers of boards made of an insulating material having circuit tracks of an electrically conductive material arranged on one side surface of each of the boards and further through-platings connecting the circuit tracks of the individual boards to one another, and circuit boards combining the printed circuit board technique, the multi-layer printed circuit board and layer techniques, e.g. the so-called mixed boards or boards provided in PTF technique (PTF: Polymer Thick-Film), requires a more accurate and reliable testing routine, as a visual inspection or examination may not reveal an incorrectness of the circuit board, especially an incorrectness of a multi-layer circuit board having incorrect circuit connections embedded within the circuit board assembly. An incorrectness of a thin-film or thick-film circuit board may also be hard to detect by visual inspection, even when a microscope is employed.

For providing a more reliable and economical testing routine than the visual inspection or examination of a circuit board, i.e. a board made of an insulating material having circuit tracks of an electrically conductive material arranged on at least one side surface thereof, such as a single-sided, double-sided or multi-layer printed circuit board, a ceramic thick-film substrate or the like, circuit board testing machines have been developed. These known testing machines are adapted to supply DC or AC current to a selected point or area of the circuit tracks of the circuit board and to determine the current transferred to other selected points or areas of the circuit tracks of the circuit board. These testing machines have been equipped or adapted to a particular circuit board layout, as individual connector pins have been arranged in a configuration corresponding to the selected points or areas of the circuit board layout in question and internally connected to current generating means and current measuring means through switching means. The testing machines have further been programmed to the circuit board layout in question, and on the basis of the information programmed into the testing machine, the machines are able to determine whether a circuit board includes the required circuit board connections and no further connections, and, consequently, whether the tested circuit board is a correct circuit board, or whether the circuit board includes erroneous connections or fails to include certain connections, and, consequently, whether the test circuit board is an incorrect circuit board. However, as the circuit board testing machine has to be equipped or adapted to the circuit board layout in question, the automatic circuit board testing routine is only profitable in connection with large-scale production of circuit boards.

Furthermore, due to the individual connector pins, the prior art testing machines are not able to test highly delicate and compact circuit boards such as thin-film or thick-film substrates, mixed boards or boards provided in PTF technique, and furthermore, they are not able to test circuit boards having components mounted thereon. The connector pin concept of the prior are testing machines also makes these machines highly liable to mechanical failure.

Therefore, there is a need for a connector assembly for a circuit board testing machine, rendering the circuit board testing machine more easily adaptable to different circuit board layouts, and, consequently, rendering it possible to perform machine tests of different circuit boards of different layouts, even of a relatively small number, and even circuit boards of highly complex, compact and elaborated configuration, such as multi-layer printed circuit boards, circuit boards provided in PTF technique, mixed boards, or highly complicated thin-film or thick-film circuit boards and, furthermore, circuit boards having components mounted thereon.

This need is fulfilled by means of a connector assembly according to the invention for a circuit board testing machine having a connector assembly for a circuit board testing machine having a test surface including a number of test points electrically insulated relative to one another and arranged in a matrix configuration and for testing a circuit board of an electrically insulating material having circuit tracks of an electrically conductive material arranged on at least one side surface thereof, the connector assembly being adapted to provide electrical connection between selected areas of the circuit board and selected test points of the test surface of the testing machine, the connector assembly comprising:

a board of an electrically insulating material having opposite first and second side surfaces, a first plurality of individual connector means being arranged on the first side surface of the connector assembly board in a configuration corresponding to said selected areas of the circuit board, a second plurality of individual connector means being arranged on the second side surface of the connector assembly board in a configuration corresponding to said selected test points of the testing machine, and electrical conductor means extending through the connector assembly board and electrically connecting said individual connector means of said first plurality to respective individual connector means of said second plurality.

Normally, the electrical conductor means extend through holes of the connector assembly. However, certain insulating materials may in a treatment be made electrically conductive, and the electrical conductor means of the connector assembly may consequently be provided in a selective treatment of the insulating material of the board.

The connector assembly normally serves the purpose of providing electrical connection between selected areas of the circuit tracks of the circuit board and selected test points of the test surface of the test machine. However, certain circuit boards, e.g. circuit boards for HF (High Frequency) applications or circuit boards involving certain security requirements such as requirements as to insulation between particular circuit tracks, may advantageously be tested by providing electrical connection by means of the connector assembly according to the invention between one or more test points of the test surface and selected areas interposed the circuit tracks of the circuit board. Furthermore, the circuit board to be tested may have components arranged thereon, e.g. discrete components, components provided in layer technique, such as printed resistors, printed capacitors, and printed inductors or chip components.

The connector assembly may in a first embodiment provide direct electrical connection between selected areas of the circuit board and the test points of the test surface through its individual connector means of the first and second pluralities and further through its electrical conductor means. However, in the presently preferred embodiment of the invention, the connector assembly further comprises at least one sheet of an electrically insulating material, arranged on one side surface of the board of the connector assembly and having through-going, electrically conductive paths. The sheet consequently serves the purpose of providing electrical connection through its through-going, electrically conductive paths between the individual connector means of the first plurality or the second plurality, arranged on the first side surface and on the second side surface, respectively, of the board of the connector assembly and selected areas of the circuit board and the selected test points of the testing machine, respectively.

The sheet is preferably of a highly insulating material, such as a sheet of a polymer material, and the through-going, electrically conductive paths are preferably constituted by metal fibres of high electrical conductivity, of a thickness of 2-100 $\mu$m, preferably 5-30 $\mu$m, and of a density of 1-20 fibres per $mm^2$. In order to reduce any corrosive influence on the metal fibres, the metal firbres are preferably of a noble metal such as silver, platinum or, preferably, gold.

As mentioned above the sheet may be arranged on the first side surface of the board of the connector assembly or, alternatively, on the second side surface of the board of the connector assembly. In the preferred embodiment of the invention, the connector assembly comprises a first and a second sheet of the above type, i.e. of an electrically insulating material and having through-going, electrically conductive paths, the first sheet being arranged on the first side surface of the board of the connector assembly, so as to establish electrical connection between said selected areas of the circuit board and the first plurality of individual connector means, and the second sheet being arranged on the second side surface of the board of the connector assembly, so as to establish electrical connection between said selected test points of the testing machine and the second plurality of individual connector means.

The teachings of the present invention are applicable to printed circuit board technique including single-sided, double-sided and multi-layer printed circuit boards, mixed boards and circuit boards provided in PTF technique, as well as to thin-film or thick-film technique, and the connector assembly according to the invention may be provided in accordance with any of these techniques or any combination of these techniques.

Consequently, the board of the connector assembly may be constituted by a board of a double-sided printed circuit board, the first or second plurality of individual connector means comprising printed circuit pads being arranged on a first side surface and on a second side surface, respectively, of the double-sided printed circuit board, and the conductor means of the connector assembly being constituted by through-platings of the double-sided printed circuit board, or the board of the connector assembly may, alternatively, be constituted by a thick-film or thin-film substrate, the first and second plurality of individual connector means comprising layers provided in thick-film or thin-film technique arranged on a first side surface and on a second side surface, respectively, of the substrate. The board of the double-sided printed circuit board and the substrate may be a solid board or substrate, respectively, or, alternatively, be constituted by a flexible sheet or foil, e.g. a polymer sheet.

It should be mentioned that the board of the connector assembly may be provided in accordance with any of the above circuit board techniques and be employed for testing a circuit board also provided in accordance with any of these techniques.

As the circuit board to be tested is conventionally designed by employing computer aided design technique (CAD-technique), the computer which actually designs the circuit board layout inherently knows the layout of the circuit board and therefore only has to be programmed as to the matrix configuration of the test points of the circuit board testing machine in question for designing the configuration of individual connector means of the first and second pluralities and, consequently, for providing the connector assembly according to the invention.

In order to make the testing machine discriminate between the different test areas of the circuit board to be tested, the number of individual connector means of said second plurality is preferably identical to that of said first plurality. Therefore, the conductor means of the connector assembly provide a one-to-one correspondence between the individual connector means arranged on the first side surface of the connector assembly board and the individual connector means arranged on the second side surface of the connector assembly board.

One of the main features of the connector assembly according to the invention is that the connector assembly, as described above, may be provided very easily involving double-sided printed circuit board technique and employing relatively inexpensive materials, and in the presently preferred embodiment of the connector assembly according to the invention the board of the double-sided printed circuit board is a conventional 1.5 mm glass fibre reinforced epoxy resin board, and the printed circuit pads are 25-100 $\mu$m Cu-layer pads, such as 35 $\mu$m or 70 $\mu$m CU-layer pads, preferably provided with gold platings.

In a further embodiment of the double-sided printed circuit board embodiment of the connector assembly according to the invention, the individual connector means of said first or second plurality may further comprise connector bodies of an electrically conductive material, as the connector bodies increase the mechanical strength of the connector means.

In a further embodiment, the conductor bodies may be arranged in respective bores of a supporting board of an electrically insulating material and aligned relative to their respective printed circuit pads. In this embodiment, the connector bodies may be solid bodies made of an electrically conductive elastomer cooperating with a substantially non-compliant or inelastic supporting board. Alternatively, the support board may be of a compliant or elastic material, and/or the connector bodies may be constituted by substantially inelastic bodies.

In an alternative embodiment of the double-sided printed circuit board embodiment of the connector assembly according to the invention including connector bodies, the connector bodies are solid, metallic bodies. The solid metallic bodies may be pins or alternatively male or female connectors adapted to cooperate with mating female or male connectors.

It is to be emphasized that the above described embodiments of the connector assembly according to the invention may be combined, in that the individual connector means of one of the pluralities may be provided in accordance with any of the above embodiments of the connector assembly, and the individual connector means of the other plurality may be provided in accordance with any of the above embodiments of the connector assembly according to the invention. Furthermore, the different embodiments of the individual connector means may be combined within one of the pluralities without departing from the concept of the present invention.

The present invention also relates to a testing machine for testing a circuit board of an electrically insulating material having circuit tracks of an electrically conductive material arranged on at least a first side surface thereof, and comprising a test surface including a number of test points electrically insulated relative to each other and arranged in a matrix configuration and the connector assembly having any of the above described characteristics of the connector assembly according to the invention and adapted to be arranged on said first side surface of the circuit board providing electrical connection between selected areas of the first side surface of the circuit board and selected test points of the test surface through the individual connector means of the connector assembly.

The circuit board testing machine is adapted to test the circuit board from the first side surface thereof. The circuit board testing machine according to the invention may alternatively or further be adapted to test a circuit board further having circuit tracks arranged on the second side surface opposite to said first side surface, i.e. to test a double-sided printed circuit board, a multi-layer printed circuit board, a circuit board provided in thin-film or thick-film technique having thin-film or thick-film layers, respectively, arranged on both side surfaces of the substrate of the circuit board, or a circuit board provided in PTF technique, or a mixed board having circuit tracks arranged on both side surfaces, and in its presently preferred embodiment the circuit board testing machine comprises two opposite test surfaces for receiving the circuit board therebetween and two connector assemblies having any of the above characteristics of the connector assembly according to the invention and adapted to be arranged on opposite side surfaces of the circuit board.

For testing a circuit board further having circuit tracks arranged on a second side surface opposite to said first side surface, the circuit board testing machine according to the invention may alternatively further comprise a short-circuiting board and a further connector assembly having any of the above characteristics of the connector assembly according to the invention and adapted to be arranged on said second side surface of the circuit board for providing electrical connection between selected areas of the second side surface of the circuit board and selected areas of the short-circuiting board.

The circuit board testing machine according to the invention may be adapted to test the circuit board by manual connection of a generator means to one or more test points of the testing machine and by detection or measurement of the signal transmission to other test points of the testing machine. Thus, the signal generator means are external means and an external signal measuring means is further employed. In an automatic circuit board testing machine according to the invention, the machine further comprises first means for generating a test signal, second means for supplying a test signal to the test points individually, third means for addressing the test points individually and for receiving a signal therefrom, and fourth means for measuring the signal received from the third means. Furthermore the circuit board testing machine may comprise control means for controlling the overall operation of the machine, such as a microprocessor controller means, and may further or alternatively be connected to external control or processing means such as an external computer which may further control an automatic production of circuit boards involving testing of the individual circuit boards by means of the circuit board testing machine according to the invention.

The present invention further relates to a method of testing a circuit board by means of a circuit board testing machine having a test surface including a number of test points electrically insulated relative to each other and arranged in a matrix configuration and for testing a circuit board of an electrically insulated material having circuit tracks of an electrically conducting material arranged on at least a first side surface thereof, the method comprising:

arranging said first side surface of the circuit board facing the test surface of the testing machine and sandwiching a connector assembly having any of the characteristics of the above described connector assembly according to the invention therebetween for providing electrical connection between selected areas of the first side surface of the circuit board and selected test points of the test surface of the testing machine through the individual connector means of the connector assembly.

If the circuit board further has circuit tracks arranged on a second side surface opposite to said first side surface, the method according to the invention may in a first embodiment further comprise employing a circuit board testing machine having a further test surface opposite to said at least one test surface and arranging the second side surface of the circuit board facing the further test surface of the testing machine and sandwiching a further connector assembly having any of the characteristics of the above described connector assembly according to the invention therebetween for providing electrical connection between selected areas of the second side surface of the circuit board and selected test points of the further test surface of the testing machine through the individual connector means of the further connector assembly, or, alternatively, in a second embodiment further comprises arranging a short-circuiting circuit board facing the second side surface of the circuit board sandwiching a further connector assembly having any of the characteristics of the above described connector assembly according to the invention therebetween for electrically interconnecting selected areas of the second side surface of the circuit board.

Normally, the selected areas of the circuit board constitute selected areas of the circuit tracks of the circuit board in order to positively test the electrical conductive circuit track or circuit pattern of the circuit board. Consequently, in accordance with a further embodiment of the method according to the invention at least one of the said selected areas may constitute a selected area of the circuit tracks of the circuit board. However, as mentioned above, certain circuit boards, e.g. circuit boards for HF (High Frequency) applications or circuit boards involving certain security requirements such as requirements as to insulation between particular circuit tracks may advantageously be tested by providing electrical connection to a selected area interposed the circuit tracks of the circuit board in order to render possible the test or measurement of the insulation between the circuit tracks in question or the capacitive or inductive coupling therebetween. Consequently, in accordance with a further or alternative embodiment of the method according to the invention at least one of the said selected areas may constitute a selected area interposed selected circuit tracks of the circuit board.

Figure 2:
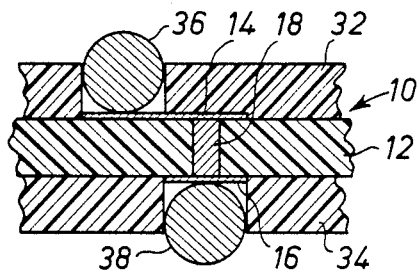
Figure 5:
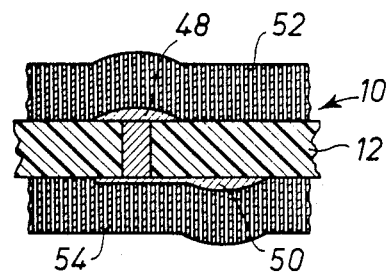
Figure 3:
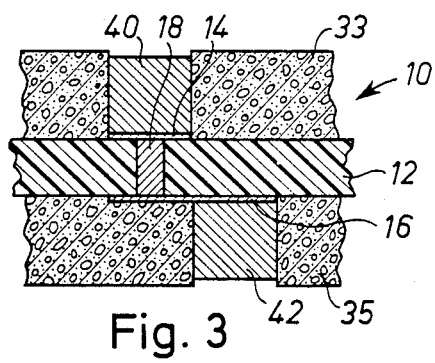
Figure 6:
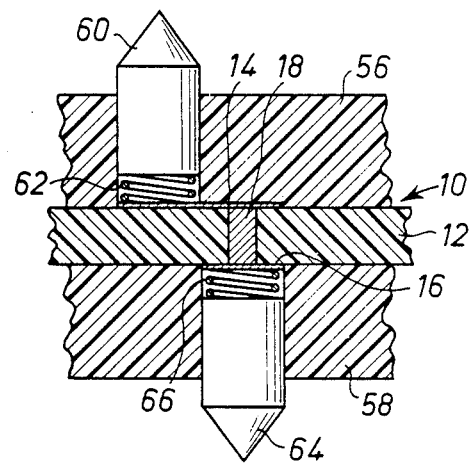
Figure 4:
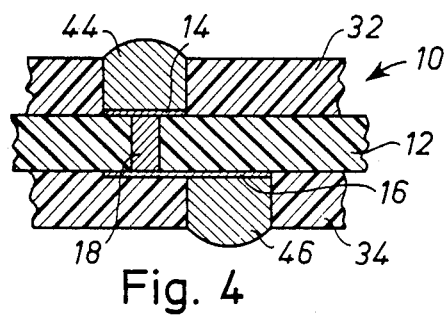
Figure 7:
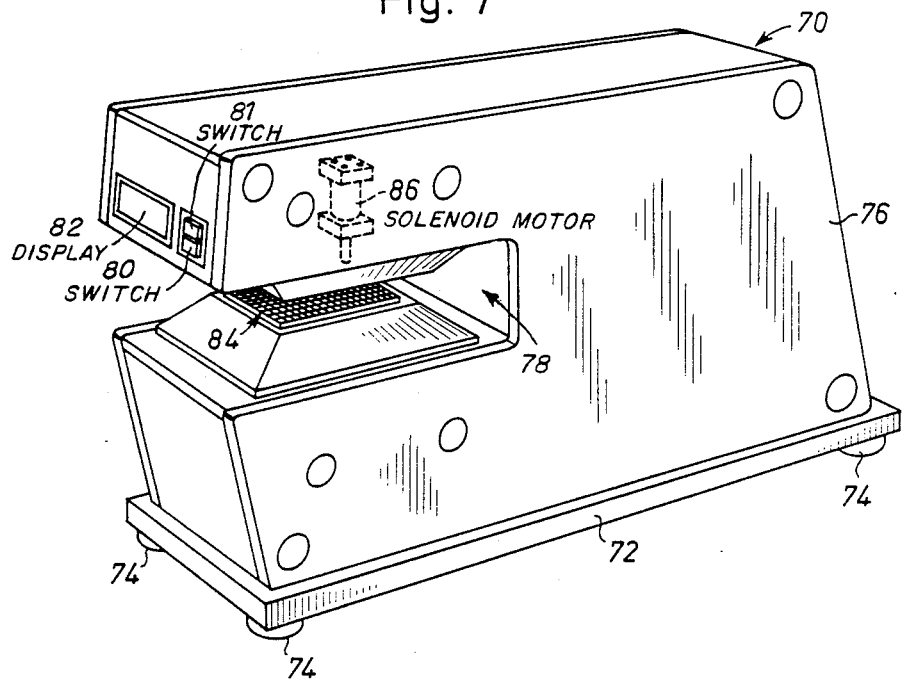
Figure 8:
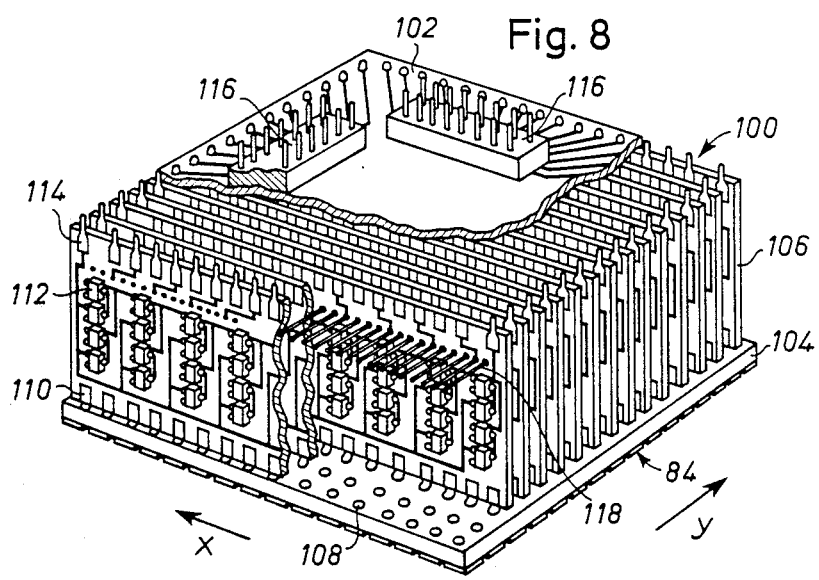
Figure 9:
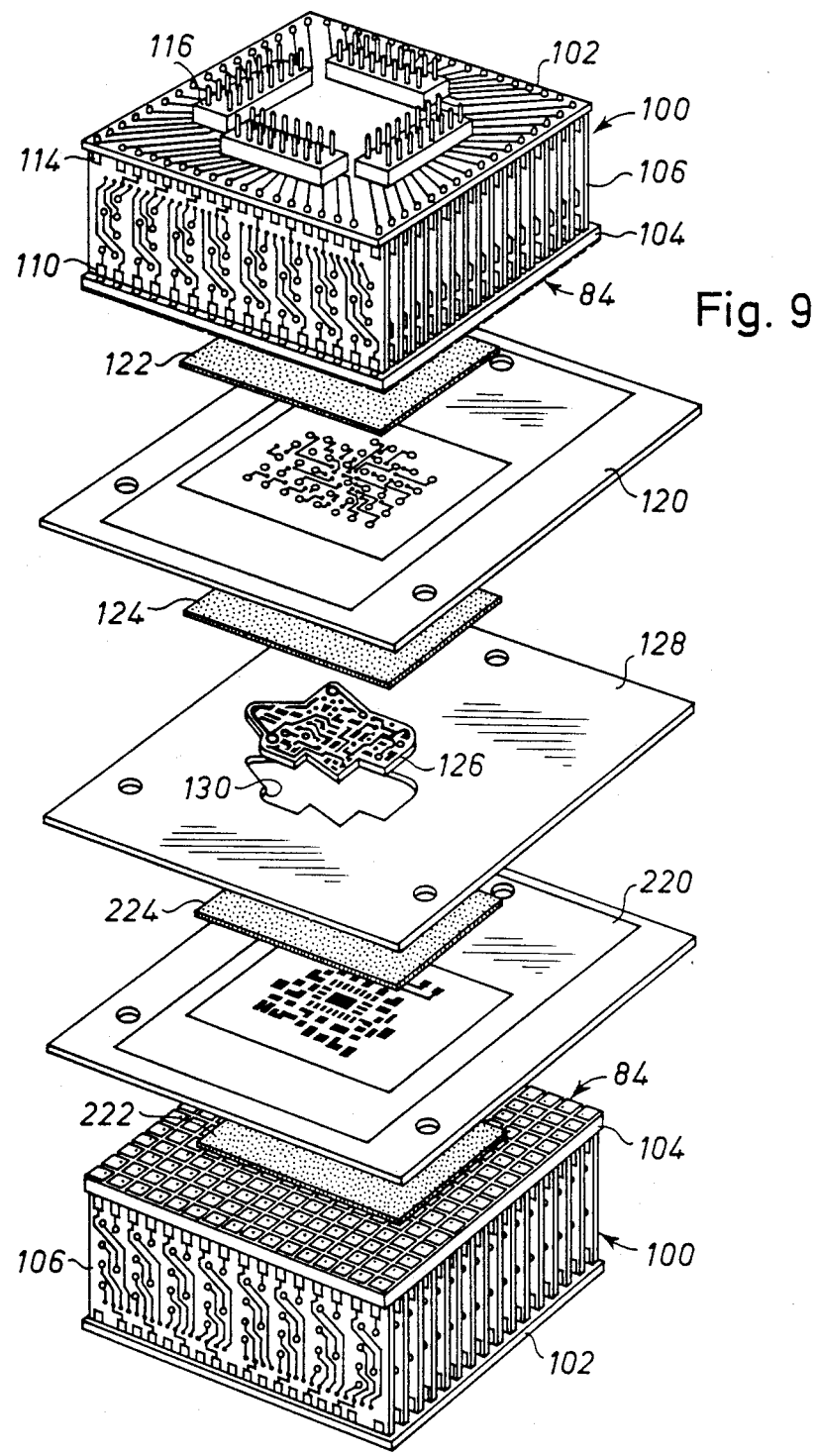

The invention will now be further described with reference to the drawings, wherein FIG. 1 is a vertical, sectional view through a top surface of a circuit board testing machine, a connector assembly according to the invention and a circuit board to be tested, FIG. 2 is a vertical, sectional view through a second embodiment of a connector assembly according to the invention, FIG. 3 is a vertical, sectional view through a third embodiment of a connector assembly according to the invention, FIG. 4 is a vertical, sectional view through a fourth embodiment of a connector assembly according to the invention, FIG. 5 is a vertical, sectional view through a fifth embodiment of a connector assembly according to the invention, FIG. 6 is a vertical, sectional view through a sixth embodiment of a connector assembly according to the invention, FIG. 7 is an overall perspective view of a circuit board testing machine according to the invention, FIG. 8 is a perspective and partially broken away view of a test head constituting a component of the circuit board testing machine shown in FIG. 7 and including a test surface of the circuit board testing machine, FIG. 9 is an exploded and perspective view of two test heads including two test surfaces and constituting two individual components of the circuit board testing machine shown in FIG. 7, and illustrating the concept of sandwiching a circuit board to be tested between two connector assemblies according to the invention which are further sandwiched between the test heads of the circuit board testing machine, FIG. 10 a vertical sectional view basically through the test head, connector assembly and circuit board set up of FIG. 9, in which one of the test heads is replaced by a short-circuiting or dummy circuit board, FIG. 11 is a diagram illustrating the matrix addressing of the test points of the test surface of the test head shown in FIGS. 8 and 9, and FIG. 12 is an overall schematical view of the circuit board testing machine shown in FIG. 7 connected to an external control computer and further illustrating the internal microprocessor of the testing machine.

In FIG. 1, a schematical, vertical, sectional view through a first embodiment of a connector assembly 10 according to the invention is shown. The connector assembly 10 comprises an assembly board 12 of an insulating material, such as a 1.5 mm glass fibre reinforced epoxy resin board, having printed circuit pads 14 and 16 arranged on the top surface and on the bottom surface, respectively, of the assembly board 12. The printed circuit pads 14 and 16 are made of 35 $\mu$m or 70 $\mu$m Cu-layers provided with gold platings, and each of the top surface printed circuit pads, such as the pad designated 14, is connected to a respective bottom surface, printed circuit pad, such as the pad designated 16 through a metallic conductor 18 constituted by a through-plating of the double-sided printed circuit board or connector assembly 10. The top surface printed circuit pads and the bottom surface printed circuit pads, such as the pads 14 and 16, respectively, are each provided with an electrically conductive connector body, such as the bodies designated 20 and 22, respectively, constituted by electrically conductive elastomeric bodies.

The connector assembly 10 is adapted to cooperate with a circuit board testing machine such as a manual testing machine or an automatic testing machine, a modified, conventional circuit board testing machine or, preferably, a circuit board testing machine according to the invention to be described below. The upper side surface part of the circuit board testing machine shown in FIG. 1 and designated the reference numeral 24 is provided with a number of test point pads, one of which is designated the reference numeral 26, and which are arranged in spaced apart, insulated relationship in a matrix configuration together constituting a test surface. Thus, the distance between two adjacent test point pads is e.g. 1/10″ (2,54 mm) or 2.5 mm. The test point pads are internally connected to switching means of the circuit board testing machine for connecting a test point pad to a current generator means or to a current detector means in order to carry out a circuit board testing routine as will be described below.

The connector assembly 10 is further adapted to cooperate with a circuit board to be tested and comprising a circuit board 28 of an insulating material, such as a conventional, printed circuit board having printed circuit tracks arranged on at least one side surface thereof, such as the printed circuit tracks or pads arranged on the lower side surface of the printed circuit board 28, one of which is designated the reference numeral 30. The printed circuit board 28 is a bare board, i.e. a board without any components mounted thereon, however, the circuit board may alternatively be provided with electronic components. Furthermore, the connector assembly 10 according to the invention may alternatively be employed for testing other circuit boards, such as thick-film or thin-film substrates having conductive layers applied on a single or both side surfaces of the substrate, multi-layer printed circuit boards, mixed boards, circuit boards provided in PTF technique or any combination of these circuit boards further provided with components if desired.

The layout of the circuit board to be tested, i.e. the layout of the printed circuit board 28, is determined solely by the layout of the electronic circuitry to be provided by the electronic component to be mounted on the circuit board. Therefore, the arrangement of the printed circuit pads 14 arranged on the top surface of the connector assembly 10 is determined by the arrangement of the printed circuit tracks or printed circuit pads arranged on the lower side surface of the printed circuit board 28. Normally, the printed circuit pads 14 are arranged aligned in relation to a printed circuit track or printed circuit pad of the printed circuit board 28 so as to establish electrical contact to the printed circuit track or the printed circuit pad in question.

However, certain circuit boards, such as circuit boards for HF (High Frequency) applications and circuit boards involving security requirements, e.g. requirements as to insulation between circuit tracks or circuit pads, are preferably tested by providing a printed circuit pad 14 at a position interposed in relation to the printed circuit tracks or printed circuit pads of the circuit board so as to render possible the detection of irregularities of the insulating area between the printed circuit pads or printed circuit tracks in question. Such irregularities may originate from insufficient etsing of the printed circuit board. In connection with substrates having layers applied on a single or both side surfaces of the substrate, there is a pronounced risk that the layers constituting the conductive circuit tracks or circuit pads of the circuit board become mashed or smeared due to deficiencies in the production process. Obviously, deficiencies of the insulation between circuit tracks or circuit pads of the circuit board may have different origin in thin-film or thick-film, multi-layer, printed circuit, etc. techniques.

Contrary to the printed circuit pads 14, the arrangement of the printed circuit pads 16 arranged on the lower side surface of the connector assembly 10, is determined by, on the one hand, the respective upper side surface printed circuit pad 14 and, on the other hand, the nearest-by test point pad 26 of the test point pad matrix configuration of the test surface of the circuit board testing machine. As many circuit boards are designed by employing computer aided design (CAD-) technique, the computer which designs the circuit board, is very easily programmed to further design the connector assembly 10 or the basic double-sided printed circuit board 12 thereof, as the computer is only to be programmed to design a double-sided printed circuit board, one side of which is determined solely by the layout of the printed circuit board 28 and the other side of which is to reveal a fixed distance connector body configuration corresponding to the matrix configuration of the test point pads 26.

As mentioned above, the circuit board assembly 10 according to the invention may be employed for testing any circuit board, such as single-sided or double-sided printed circuit boards, multi-layer printed circuit boards, mixed circuit boards, circuit boards provided in thick-film or thin-film technique or in PTF technique or any combination of the these techniques. Furthermore the connector assembly 10 according to the invention may be provided in accordance with any of these techniques in order to fulfill any specific requirements, such as requirements as to rigidity, flexibility or strength of the connector assembly 10 and further any production concerned. Normally a printed circuit board, such as a single-sided, a double-sided or a multilayer printed circuit board is tested by employing a connector assembly 10 according to the invention provided in printed circuit board technique. Similarly, a circuit board provided in layer or film technique may be tested by employing a connector assembly also provided in accordance with the film technique in question. However, the production technique may be combined in that a connector assembly 10 provided in for example printed circuit board technique, may be employed for testing a thick-film substrate or vice versa. However, in order to provide a fairly cheap, yet accurate connector assembly, the printed circuit board technique is preferably employed for most testing applications, such as the testing of printed circuit boards, thick-film substrates, mixed circuit boards or circuit boards provided in PTF technique.

As is conventional in the art and will be described below in greater detail with reference to FIG. 11, the actual test routine is carried out by supplying DC or AC current to the individual test point pads 26 one at a time, and by detecting the current transfer to any other test point pad of the test surface. As will be evident, the test point pads 26 are connected individually through the connector bodies 22, the lower side printed circuit pads 16, the through-platings 18, the top surface, printed circuit pad 14 and the connector bodies 20 to a respective printed circuit pad or part of a printed circuit track 30 of the printed circuit board 28 to be tested.

In FIG. 2, an alternative or second embodiment of the connector assembly 10 according to the invention is shown. Apart from the above described components, the assembly board 12, the printed circuit pads 14 and 16 and the through-plating 18, the connector assembly comprises an upper side surface board 32 and a lower side surface board 34 of an insulating material, such as the material of the assembly board 12, e.g. glass fibre reinforced epoxy. In cylindrical bores of the supporting boards, electrically conductive, spherical connector bodies 36 and 38, are arranged. The spherical connector bodies 36 and 38 are press-fitted into the respective bores of the respective boards, which maintain them aligned relative to the printed circuit pads 14 and 16, respectively.

In FIGS. 3 and 4, a third and a fourth embodiment of the connector assembly according to the invention is shown, basically identical to the embodiment of the connector assembly shown in FIG. 2, however, differing therefrom in that the electrically conductive, spherical connector bodies 36 and 38 are substituted by electrically conductive, cylindrical or cubic bodies 40 and 42, respectively, shown in FIG. 3 and electrically conductive, cylindrical bodies 44 and 46, respectively, shown in FIG. 4, having outwardly domed surfaces. Furthermore, in FIG. 3, the upper side surface board 32 and the lower side surface board 34, shown in FIGS. 2 and 4, which are substantially non-compliant or inelastic supporting boards, are replaced by compliant or elastic upper side surface and lower side surface boards designated 33 and 35, respectively.

The bodies 36 and 38 of FIG. 2, the bodies 40 and 42 of FIG. 3, and the bodies 44 and 46 of FIG. 4 may be constituted by conduction elastomeric bodies, such as bodies provided from the material Consil ® —E, —II, —R, —C, or SC-Consil ® from the company Tecknit ®, EMI Shielding Products. Alternatively, the bodies 36, 38, 40, 42, 44, 46 may be constituted by bodies of wire mesh resilient contact elements of the type Fuzz Button ® of the above company.

In FIG. 5, a fifth and presently preferred embodiment of the connector assembly 10 according to the invention is shown. In this embodiment of the invention, the above printed circuit pads 14 and 16 are substituted by printed circuit pads or printed circuit tracks 48 and 50, respectively, of an outwardly domed configuration. It should be mentioned that the printed circuit tracks 48 and 50 of the presently preferred embodiment of the connector assembly 10 according to the invention render it possible to test the circuit boards not only at specific points determined by the positions of the circuit pads but also at more spacious areas such as at insulating areas between circuit tracks or circuit pads of the circuit board. On the upper side surface and on the lower side surface of the assembly board 12, an upper side surface sheet 52 and a lower side surface sheet 54, respectively, are arranged, the sheets being made of an electrically insulating material in which through-going electrically conductive paths are embedded. The sheet material has been supplied from the company CHOMERICS ®, under the name CHO-NECTOR ®, described in Technical Bulletin No. 972, and further from the company Shin-Etsu Polymer Co., Ltd., under the name of Shinetsu Interconnector "MAF" type.

In FIG. 6 a sixth embodiment of the connector assembly according to the invention is shown. The embodiment shown in FIG. 6 is a further embodiment of the above described embodiments shown in FIGS. 2–4 and comprises, apart from the assembly board 12, the printed circuit pads 14 and 16 and the through-plating 18, an upper side surface board 56 and a lower side surface board 58 of an insulating material. In through-going bores of the boards 56 and 58, two connector means are arranged in electrically conductive connection with the printed circuit pads 14 and 16. The connector means of the upper side surface board 56 comprises a solid, metallic body 60 and a coil 62 biasing the body 60 outwardly or upwards, and the connector means of the lower side surface board 58 comprises a solid, metallic body 64 and a coil 66 biasing the body 64 outwardly or downwards.

In FIG. 7, a circuit board testing machine according to the invention is shown designated 70 in its entirety. The circuit board testing machine comprises a base frame 72 to the lower side surface of which four feet 74 are secured. The machine 70 further comprises a housing 76 in which a front recess 78 is provided. The machine 70 is a mains operated electric or electronic apparatus and on the front surface of the housing, operator operable switches 80 and 81 are arranged next to a display 82 which serves the purpose of displaying information to the operator regarding the testing of a circuit board and the state of the apparatus.

In the front recess 78, a first and a second test surface, or an upper and a lower test surface of the testing machine are defined. In FIG. 7, only the second or lower test surface is shown and designated 84. The upper and lower test surfaces of the testing machine 70 are identical to each other and defined on an outer side surface of a test head shown in FIG. 8 which constitutes a component of the circuit board testing machine 70. The lower test surface 84 and also the upper test surface not shown in FIG. 7 comprise a number of test points electrically insulated relative to one another and arranged in a matrix configuration. In the embodiment of the testing machine 70 shown in FIG. 7 and of the test head of the testing machine shown in FIG. 8, a test point matrix of 16×16 is defined. The test surfaces or at least one of the test surfaces are mounted so as to reciprocate to and from the opposite test surface by means of one or more motors generating the reciprocating motion or motions of the test surface or the test surfaces, respectively. The motor or motors may be constituted by any appropriate motor device, such as an electromagnetic motor, e.g. an electromotor or a solenoid motor, a device operated by compressed air or by a pressurized fluid, e.g. a hydraulic device. In the embodiment of the circuit board testing machine shown in FIG. 7, only the upper test surface of the testing machine is movable by means of a motor which is shown in dashed lines and is constituted by a solenoid motor 86.

In FIG. 8, one of the test heads of the circuit board testing machine 70 of the present invention is shown. The test head is designated the reference numeral 100 and is basically a circuit board assembly comprising a top circuit board 102, a base circuit board 104 and a plurality of circuit boards 106 interconnecting the top circuit board 102 and the base circuit board 104. As evident from FIG. 8, the plurality of circuit boards 106 constitutes a total of sixteen circuit boards corresponding to the dimension of the test point matrix 16×16. The outer, or lower as shown in FIG. 8, side surface of the base circuit board 104 constitutes the test surface 84 of the test head and consequently one of the test surfaces of the circuit board testing machine. Each point of the test surface is connected to one of the circuit boards 106. The circuit boards 106 define an X-co-ordinate of the test points of the test surface, and on each of the circuit boards 106 an Y-coordinate of the individual test point of the test surface is further defined. Any test point of the test surface may consequently be defined by a set of co-ordinates (X,Y).

The base circuit board 104 as well as the top circuit board 102 and the circuit boards 106 are double-sided printed circuit boards. The test points of the test surface 84 are consequently constituted by individual Cu-layer pads of a thickness of 35 $\mu$m or 70 $\mu$m, further provided with gold platings. Through a through-plating each test point of the test surface, i.e. each circuit pad on the lwoer or outer side surface of the base circuit board 104 is connected to a terminal 108 on the upper side surface of the base circuit board 104. The circuit boards 106 have connector terminals one of which is designated the reference numeral 110 and which are soldered to the terminals 108 of the base circuit board 104 in order to provide electrically conductive connection between the connector terminals 110 of the circuit boards 106 and respective test points of the test surface 84.

Through addressing or switching transistors, one of which is designated the reference numeral 112 and of a configuration to be described below with reference to FIG. 11, the terminals 110 are connected to further connector terminals, one of which is designated the reference numeral 114 of the circuit boards 106.

The terminals 114 are received in soldered connections of the top circuit board 102 and through printed circuit tracks connected to multi-pin plugs 116 which, as is evident from FIG. 8, comprises a total of sixteen pins each. On the top circuit board 102, a total of four multi-pin plugs 116 are provided. Consequently, the 16×16 matrix of the test points of the test surface are addressable through four sixteen pin plugs 116.

In addition to the connector terminals 110 and 114 and the internal circuit tracks of the circuit board, the circuit boards 106 are interconnected through solid rod connectors, one of which is designated the reference numeral 118 which extend through through-going holes of the circuit boards 106. Evidently, the test head may be modified into a test head of a different matrix configuration, e.g. into a test head comprising a 24×24 matrix test point configuration or a 32×32 or any other matrix test point configuration.

FIG. 9 shows an exploded view of the test heads 100, one of which was shown in FIG. 8, of the circuit board testing machine 70 shown in FIG. 7 according to the invention, and further of two connector assemblies according to the invention and a circuit board to be tested. In the top of FIG. 9, a first or top test head is shown defining a test surface 84 facing downwardly. Below the downwardly facing test surface of the test head 100, a connector assembly of the type described above with reference to FIG. 5 is shown comprising a double-sided printed crircuit board 120, a first sheet 122 and a second sheet 124 of the above described type including through-going electrically conductive fibres.

On the upper side surface of the double-sided printed circuit board 120, a circuit pad layout and circuit track layout is provided in accordance with the teaching of the present invention providing electrical connection to selected test points of the test surface 84. Below the lower side surface of the double-sided printed circuit board 120, and further below the sheet 124, a circuit board 126 is shown. The circuit board 126 constitutes a thick-film circuit board having thick-film layers arranged on both side surfaces and through-platings providing connections from the upper side surface of the thick-film circuit board to the lower side surface thereof. The thick-film circuit board 126 is fixed in a fixation board 128 in which an aperture 130 of a configuration which is conform to the outer contour of the thick-film circuit board 126 is provided. Below the lower side surface of the thick-film circuit board 126, a second connector assembly according to the invention is shown comprising a double-sided printed circuit board 220 basically corresponding to the above double-sided printed circuit board 120, and a first sheet 222 and a second sheet 224 corresponding to the above sheets 122 and 124, respectively. Below the lower side surface of the double-sided printed circuit board 120, a further test head 100 is shown defining an upwardly facing test surface 84.

Evidently, the provision of two connector assemblies according to the invention and two test heads of the circuit board testing machine according to the invention sandwiching the circuit board such as the double-sided thick-film circuit board 126 therebetween as shown in FIG. 9, renders it possible to carry out a test routine for testing both side surfaces of the circuit board and further through-going connections or through-platings of the circuit board to be tested. As mentioned above, the teaching of the present invention also renders it possible to test the insulation between circuit pads or circuit tracks of either of the sides of the double-sided circuit board by providing access from a test point of one of the test surfaces to a selected area interposed the circuit tracks or circuit pads of the circuit board to be tested through one of the connector assemblies according to the invention.

As mentioned above, the test heads of the testing machine 70 are reciprocated in relation to each other so as to sandwich the connector assemblies according to the invention having the circuit board to be tested sandwiched therebetween FIG. 10 shows a vertical sectional view through the top test head 100 shown in the upper part of FIG. 9, the first connector assembly according to the invention comprising the double-sided printed circuit board 120 and the sheets 122 and 124, and further through the thick-film circuit board 126 to be tested and the sheet 224. Instead of the double-sided printed circuit board 220, the sheet 222 and the lower test head 100, a short-circuiting or dummy circuit board 132 is arranged below the sheet 224. The short-circuiting or dummy circuit board 132 is provided with short-circuiting circuit tracks 134.

Whereas in FIG. 9 each circuit pad or circuit track or each area interposed the circuit tracks or circuit pads and further the through-going connections of the circuit board may be tested indiviually from one side or from both sides of the circuit board, the short-circuiting or dummy circuit bord 132 shown in FIG. 10 renders it possible to test the circuit tracks or circuit pads of the one side surface of the circuit board, i.e. the thick-film circuit board 126 and further the circuit tracks or circuit pads of the opposite side surface of the thick-film circuit board and the through-going connections or the through-platings of the circuit board 126. It should, however, be emphasized that the one side access double-sided testing routine which may be carried out by employing the short-circuiting or dummy circuit board 132 does not render it possible for all circuit board layouts to discriminate between short-circuit connections of the circuit board, i.e. of the circuit board 126, and the short-circuiting connections provided by the short-circuiting tracks 134 of the dummy or short-circuiting circuit board 132. Therefore, the double-sided double-access testing routine shown in FIG. 9 is to be preferred for most applications, and particularly for applications involving highly compact and highly delicate circuit track layouts of the circuit board to be tested.

In FIG. 11, four test points 150, 152, 154 and 156 of a test surface of the above described test head are shown schematically. Apart from these test points, the test surface comprises the further test points of the test point matrix configuration. The first test point 150 is connected to the collector of a first PNP transistor 160 and to the collector of a first NPN transistor 161. Similarly, the test points 152, 154 and 156 are connected to the collectors of a second, a third, and a fourth PNP transistor 162, 164 and 166, respectively, and to the collector of a second, a third, and a fourth NPN transistor 163, 165 and 167, respectively. The test points 150 and 152 constitute test points of an identical X-co-ordinate, i.e. test points which are connected to one and the same of the circuit boards 106 shown in FIG. 8. Similarly, the test points 154 and 156 are test points of an identical X-co-ordinate, however of an X-co-ordinate different from the X-co-ordinate of the test points 150 and 152. As will be evident from description below, the Y-co-ordinate of the first and third test points, i.e. the test points 150 and 154 are identical to each other, and the Y-co-ordinate of the second and fourth test points, i.e. the test points 152 and 156 are also identical to each other.

The bases of the first and second PNP transistors 160 and 162 are connected to each other and the bases of further PNP transistors of the further test points of identical X-co-ordinate and further to a pin 170 of a multi-pin plug designated $X_1$, which is a multi-pin plug corresponding to the multi-pin plugs 116 shown in FIG.

8. Similarly, the bases of the first and second NPN transistors 161 and 163 are connected to each other and to the bases of further NPN transistors of the further test points of identical X-co-ordinate and further to a pin 172 of a multi-pin plug $X_2$. The bases of the third and fourth PNP transistors 164 and 166 are connected to each other and to the bases of the further PNP transistors corresponding to the further test points of identical X-co-ordinate and further to a pin 174 of the multi-pin plug $X_1$. The bases of the third and fourth NPN transistors 165 and 167 are connected to each other and to the bases of the further NPN transistors corresponding to the test points of identical X-co-ordinate and further to a pin 176 of the multi-pin plug $X_2$.

The emitters of the first and third PNP transistors 160 and 164 which correspond to the test points of identical Y-co-ordinate are connected to each other and connected to the emitters of the PNP transistors of the further test points of identical Y-co-ordinate and further to a pin 171 of a multi-pin plug designated $Y_1$. The emitters of the first and third NPN transistors 161 and 165 which correspond to the test points of identical Y-co-ordinate are connected to each other and connected to the emitters of the PNP transistors of the test points of identical Y-co-ordinate and further to a pin 173 of a multi-pin plug designated $Y_2$. Similarly, the emitters of the second and third PNP transistors 162 and 166 are connected to each other and connected to the emitters of the PNP transistors of the test points of identical Y-co-ordinate and further to a pin 175 of the multi-pin plug $Y_1$. Similarly, the emitters of the second and third NPN transistors 163 and 167 are connected to each other and connected to the emitters of the PNP transistors of the test points of identical Y-co-ordinate and further to a pin 177 of the multi-pin plug $Y_2$.

The switching and addressing transistor array shown in FIG. 11 functions in the following manner: The PNP transistors, i.e. the transistors 160, 162, 164 and 166 constitute transmit switches, whereas the NPN transistors, i.e. the transistors 161, 163, 165 and 167 constitute receive switches. If the test point 150 constitutes a current transmit test point, the pin 171 is switched high and a low base current is input through the pin 170 to the base of the PNP transistor 160 which consequently supplies a high gain collector current to the test point 150 the potential of which also switches high. The second transmit switch 162 constituted by the second PNP transistor blocks as the emitter of the transistor is not switched high. The third and fourth transmit switches constituted by the third and fourth PNP transistors 164 and 166, respectively, also block as no base current are input to the transistors through the pin 174. It should be emphasized that the addressing a particular test point of co-ordinates X,Y is carried out by switching the emitters of the transmit switches or the transmit PNP transistors of the Y-co-ordinate in question high and by inputting a low base current into the bases of the transmit switches or PNP transistors of the X-co-ordinate in question.

Similarly, the receive addressing is carried out by addressing an X-co-ordinate through the $X_2$ multi-pin plug, i.e. through the pin 172 or the pin 176 shown in FIG. 11 and by sensing the voltages of the receive switches through the $Y_2$ multi-pin plug, i.e. through the pins 176 and 177 shown in FIG. 11. It should be realized that as the voltage of the transmit test point is switched high, a further test point electrically connected therewith is also switched high and the collector of the receive switch or the receive NPN transistor connected to the further test point, e.g. the second NPN transistor 163 connected to the second test point 152 is also switched high. By inputting a low base current through the pin 172 of the $X_2$ multi-pin plug, the NPN transistor 163 starts conducting and switches its emitter high which is detected through the pin 177. If the second test point 152 is not connected to the transmit test point 150, the receive switch or receive NPN transistor 163 does not switch its emitter high inspite of the input of the low base current through the pin 172. Obviously, the pin 173 switches high due to the "receive" switch 161, but the pin 177 does not switch high, and it is therefore easily detected that no connection is provided between the test points 150 and 152. It should be emphasized that the addressing of the receive switches is carried out by inputting a low base current into the receive NPN transistors, i.e. through the pins of the $X_2$ multi-pin plug and by detecting or sensing the voltages of the emitters of the receive NPN transistors through the pins of the $Y_2$ multi-pin plug.

As will be understood, the testing routine to be performed by addressing the bases of the transmit and the receive transistors and by switching the collector of a single transmit transistor high and further by detecting the voltages of the emitters of the receive transistors is very easily carried out in an automatic testing machine by employing a microprocessor or a similar controlling means. Obviously, the controlling means may be an external computer. However, in the presently preferred embodiment of the circuit board testing machine according to the invention, a microprocessor is included in the circuit board testing machine for controlling the above transmit and receive addressing routines of the testing routine.

In FIG. 12, a block diagram of the presently preferred embodiment of the circuit board testing machine is shown. As mentioned above, the circuit board testing machine 70 comprises a microprocessor 180 which controls the overall operation of the apparatus and which consequently addresses the transmit and receive switches as described above and which is operated by means of the operator operable switches 80 and 81 and displays information to the operator by means of the display 82. The microprocessor 180 preferably further communicates through an input/outport port with an external computer such as a minicomputer 182 shown in FIG. 12. The minicomputer 182 comprises a terminal keyboard 183 and a display 184 and communicates with a store 186 and further with a printer 188. In the set-up shown in FIG. 12, the microprocessor of the circuit board testing machine 70 according to the invention further communicates with a sorter 190. The circuit boards which have been tested by means of the circuit testing machine are transferred, e.g. by means of a conveyor, to the sorter 190 which is addressed from the microprocessor 180 of the testing machine for transferring the circuit board into the cathegory to which it belongs. On the basis of the test routines carried out under the control of the microprocessor 180, it is possible to determine not only whether the circuit board is a correct circuit board, but also—if certain deficiencies have been detected—to determine what to do with the circuit board, i.e. to have it repaired or discarded. These alternatives are illustrated by a box 192 in the lower left-hand side of FIG. 12.

The provision of a microprocessor 180 for controlling the overall operation of the circuit board testing machine 70 renders it possible not only to carry out the above addressing and testing routines controlled by the apparatus itself, but also to provide a "self learning" circuit board testing machine. As will be appreciated, the circuit board testing machine has to learn which of the test points of the test surfaces of the testing machine are connected to each other and which test points are not connected to other test points of the test surfaces. In a first operational mode of the apparatus and consequently in a first operational mode of the microprocessor 180, a correct circuit board is so to speak tested by the testing machine. The correct circuit board is arranged sandwiched between the connector assemblies according to the invention and further sandwiched between the test heads of the circuit board testing machine according to the invention, and by addressing the individual test points of the two test heads the microprocessor of the testing machine learns which test points are connected to each other and which test points are not connected to other test points. This information is stored in the microprocessor and may further or alternatively be stored in the external store 186 of the computer 182 for later use. In addition to the self learning routine an operator may through the external computer 182 define certain test points, e.g. test points corresponding to high insulation areas between circuit tracks or circuit pads of the circuit boards to be tested.

Although the invention has been described with reference to different embodiments, it is to be understood that numerous amendments are obvious to the skilled art worker within the scope of the present invention as defined in the appending claims.

I claim:

1. A method of testing a circuit board by means of a circuit board testing machine having a test surface including a number of test points electrically insulated relative to one another and arranged in a matrix configuration and for testing a circuit board of an electrically insulating material having circuit tracks of an eletrically conductive material arranged on at least a first side surface thereof, the method comprising:
   providing a connector assembly adapted to provide electrical connection between selected areas of said first side surface of the circuit board and selected test points of the test surface of the testing machine, and wherein said connector assembly comprising:
   a board of an electrically insulating material having opposite first and second side surfaces,
   a first plurality of individual connector pads being arranged on the first side surface of the connector assembly board in a configuration corresponding to said selected areas of said first side surface of the circuit board,
   a second plurality of individual connector pads being arranged on the second side surface of the connector assembly board in a configuration corresponding to said selected test points of said test surface of the testing machine,
   electrical cconductor means extending through the board of the connector assembly board and electrically connecting said individual connector pads of said first plurality to respective individual connector pads of said second plurality, and
   connector contact means secured to each of said connector pads of said first plurality and of said second plurality,
   arranging said first side surface of the circuit board facing said test surface of the testing machine,
   arranging said connector assembly so as to have its first side surface face said first side surface of the circuit board and so as to have its second side surface face said test surface of said testing machine, and
   sandwiching said connector assembly between said first side surface of the circuit board and said test surface of the testing machine so as to provide electrical connection between said selected areas of said first side surface of the circuit board and said selected test points of the test surface of the testing machine through said connector contact means secured to said connector pads of said first plurality, through said individual connector pads of said first plurality, through said electrical conductor means, through said individual connector pads of said second plurality, and through said second connector contact means secured to said connector pads of said second plurality.

2. A method according to claim 1, wherein said connector contact means comprises at least one sheet of an electrically insulating material, arranged on one side surface of the board of the connector assembly and having through-going, electrically conductive paths.

3. A method according to claim 2, wherein said sheet is a polymer sheet, and wherein the through-going, electrically conductive paths are constituted by metal fibres of high electrical conductivity, of a thickness of 2–100 $\mu$m, and of a density of 1–20 fibres per mm$^2$.

4. A method according to claim 3, wherein the metal fibres are of a noble metal.

5. A method according to claim 2, wherein the connector contact means comprises a first and a second sheet of an electrically insulating material and having through-going, electrically conductive paths, the method further comprising arranging said first sheet on the first side surface of the board of the connector assembly so as to establish electrical connection between said selected areas of the circuit board and said individual connector pads of said first plurality, and arranging said second sheet on the second side surface of the board of the connector assembly, so as to establish electrical connection between said selected test points of the testing machine and said individual connector pads of said second plurality.

6. A method according to claim 1, wherein the board of the connector assembly is constituted by a board of a double-sided printed circuit board having a first and a second side surface, wherein said individual connector pads of said first plurality and of said second plurality comprise printed circuit pads arranged on said first side surface and on said second side surface, respectively, of the double-sided printed circuit board, and wherein said electrical conductor means are constituted by through-platings of said double sided printed circuit board.

7. A method according to claim 6, wherein the board of the double-sided printed circuit board is a 1.5 mm glass fibre reinforced epoxy resin board, and wherein the printed circuit pads are 25–100 $\mu$m Cu-layer pads, provided with gold platings.

8. A method according to claim 7, wherein the individual connector means of said first or second plurality further comprise connector bodies of an electrically conductive material.

9. A method according to claim 8, wherein the connector bodies are arranged in respective bores of a supporting board of an electrically insulating material and aligned relative to their respective printed circuit pads.

10. A method according to claim 9, wherein the connector bodies are solid bodies of an electrically conductive elastomer.

11. A method according to claim 9, wherein the connector bodies are solid, metallic bodies.

12. A method according to claim 1, wherein the board of the connector assembly is constituted by a thick-film substrate, and wherein said first and second plurality of individual connector pads comprise layers provided in thick-film technique and arranged on a first side surface and on a second side surface, respectively, of the substrate.

13. A method according to claim 1, wherein the board of the connector assembly is constituted by a thin-film substrate, and wherein said first and second plurality of individual connector pads comprise layers provided in thin-film technique and arranged on a first side surface and on a second side surface, respectively, of the substrate.

14. A method according to claim 1, wherein the number of individual connector pads of said second plurality is identical to that of said first plurality.

15. A method according to claim 1 and of testing a circuit board further having circuit tracks arranged on a second side surface opposite to said first side surface, the circuit board testing machine having a further test surface opposite to said at least one test surface, said further test surface including a number of test points electrically insulated relative to one another and arranged in a matrix configuration, the method further comprising:
providing a further connector assembly adapted to provide electrical connection between selected areas of said second side surface of the circuit board and selected test points of said further test surface of the testing machine, and said further connector assembly comprising:
a board of an electrically insulating material having opposite first and second side surfaces,
a first plurality of individual connector pads being arranged on the first side surface of the connector assembly board in a configuration corresponding to said selected areas of said second side surface of the circuit board,
a second plurality of individual connector pads being arranged on the second side surface of the connector assembly board in a configuration corresponding to said selected test points of said further test surface of the testing machine,
electrical conductor means extending through the board of the connector assembly board and electrically connecting said individual connector pads of said first plurality to respective individual connector pads of said second plurality, and
connector contact means secured to each of said connector pads of said first plurality and of said second plurality,
arranging said second side surface of the circuit board facing said further test surface of the testing machine, arranging said further connector assembly so as to have its first side surface face said second side surface of the circuit board and so as to have its second side surface face said further test surface of said testing machine, and sandwiching said further connector assembly between said second side surface of the circuit board and said further test surface of the testing machine so as to provide electrical connection between said selected areas of said second side surface of the circuit board and said selected test points of the test surface of the testing machine through said further connector assembly's connector contact means secured to said connector pads of said first plurality, through said further connector assembly's individual connector pads of said first plurality, through said further connector assembly's electrical conductor means, through said further connector assembly's individual connector pads of said second plurality, and through said further connector assembly's second connector contact means secured to said connector pads of said second plurality.

16. A method according to claim 1 and of testing a circuit board further having circuit tracks arranged on a second side surface opposite to said first side surface, the method further comprising:
providing a short-circuiting circuit board adapted to provide electrical interconnection between selected areas of said second side surface of the circuit board said short-circuiting circuit board comprising:
a board of an electrically insulating material having opposite first and second side surfaces,
a first plurality of individual connector pads being arranged on the first side surface of the short-circuiting circuit board in a configuration corresponding to said selected areas of said second side surface of the circuit board,
a second plurality of individual connector pads being arranged on the second side surface of the short-circuiting circuit board,
electrical conductor means extending through the board on the short-circuiting circuit board and electrically connecting said individual connector pads of said first plurality to respective individual connector pads of said second plurality,
short-circuiting tracks being arranged on the second side surface of the short-circuiting circuit board interconnecting selected individual connector pads of said second plurality corresponding to said selected areas of said second side surface of the circuit board, and
connector contact means secured to each of said connector pads of said first plurality and of said second plurality,
arranging said second side surface of the circuit board facing said further test surface of the testing machine,
arranging said short-circuiting circuit board so as to have its first side surface face said second side surface of the circuit board and so as to have its second side surface face said further test surface of said testing machine, and
sandwiching said short-circuiting circuit board between said second side surface of the circuit board and said further test surface of the testing machine so as to provide electrical interconnection between said selected areas of said second side surface of the circuit board through said short-circuiting circuit board's connector contact means secured to said connector pads of said first plurality, through said short-circuiting circuit board's individual connector pads of said first plurality, through said short-circuiting board's electrical conductor means, through said short-circuiting circuit board's individual connector pads of said second plurality, through said short-circuiting circuit board's second connector contact means secured to said connector pads of said second plurality, and through said short-circuiting circuit board's short-circuiting tracks.

17. A method according to claim 1, wherein one of said selected areas constitutes a selected area of the circuit tracks of the circuit board.

18. A method according to claim 1, wherein one of the said selected areas constitutes a selected area interposed between circuit tracks of the circuit board.

* * * * *

UNITED STATES PATENT AND TRADEMARK OFFICE
CERTIFICATE OF CORRECTION

PATENT NO. : 4,833,402

DATED : May 23, 1989

INVENTOR(S) : Allan Boegh-Petersen

It is certified that error appears in the above-identified patent and that said Letters Patent is hereby corrected as shown below:

Column 1, line 23, "boads" should be -- boards --
Column 3, line 40, "firbres" should be -- fibers --
Column 9, lines 25-26, "etsing" should be -- etching --
Column 11, line 61 "Ihe" should be -- The --
Column 12, line 42, "lwoer" should be -- lower --
Column 14, line 16, "indiviually" should be -- individually --
Column 14, line 18, "bord" should be -- board --
Column 15, line 53, insert -- of -- between "addressing" and "a"
Column 17, line 59, "cconductor" should be -- conductor --
Column 20, line 34, "on" should be -- of --

Signed and Sealed this

Thirtieth Day of April, 1991

Attest:

HARRY F. MANBECK, JR.

Attesting Officer

Commissioner of Patents and Trademarks